United States Patent [19]

Thong

[11] Patent Number: 4,672,306
[45] Date of Patent: Jun. 9, 1987

[54] ELECTRONIC PROBE HAVING AUTOMATIC READOUT OF IDENTIFICATION AND STATUS

[75] Inventor: Tran Thong, Beaverton, Oreg.

[73] Assignee: Tektronix, Inc., Beaverton, Oreg.

[21] Appl. No.: 720,762

[22] Filed: Apr. 8, 1985

[51] Int. Cl.⁴ ............................................. G01R 31/02
[52] U.S. Cl. ..................................... 324/72.5; 364/550
[58] Field of Search ..................... 324/72.5, 158 P; 364/550, 551, 579, 483

[56] References Cited

U.S. PATENT DOCUMENTS 4,398,258  8/1983  Naitoh et al. ...................... 364/551
4,401,949  8/1983  Gold ................................. 324/73 AT
4,493,044  1/1985  Hoeren et al. ...................... 364/579
4,541,100  9/1985  Sutton et al. ...................... 364/551
4,575,803  3/1986  Moore ............................... 364/550

Primary Examiner—Reinhard J. Eisenzopf
Assistant Examiner—Jack B. Harvey
Attorney, Agent, or Firm—William S. Lovell; John Smith-Hill; Robert S. Hulse

[57] ABSTRACT

An electronic probe assembly provides previously recorded data as to probe identification and optimum compensation tuning of the probe to a connected "intelligent" test and measurement device so that proper test procedures may be confirmed, either by display of such data or by the generation of error messages.

15 Claims, 5 Drawing Figures

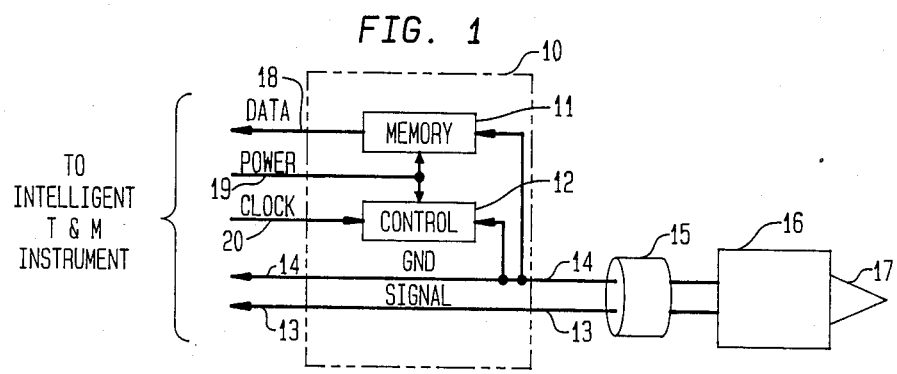
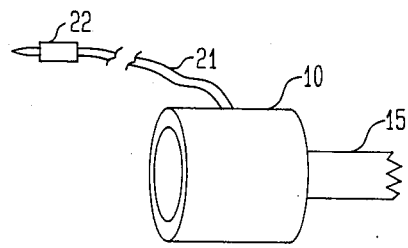
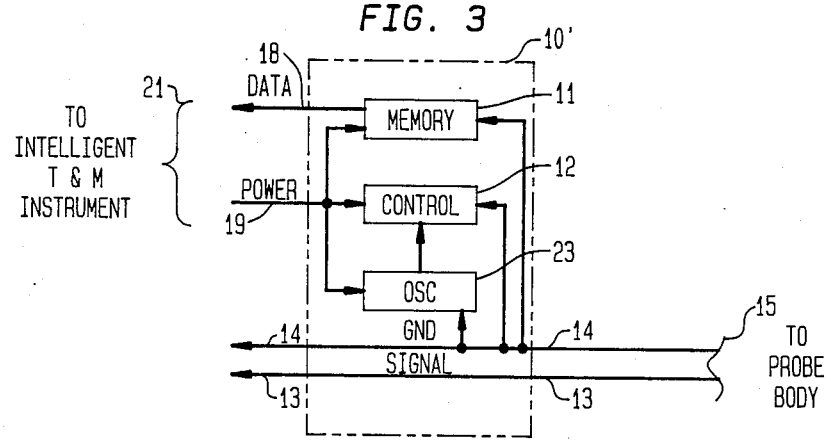

ELECTRONIC PROBE HAVING AUTOMATIC READOUT OF IDENTIFICATION AND STATUS

FIELD OF THE INVENTION

This invention relates to probe devices for connecting an electronic circuit under test to a measurement instrument, and more specifically to self-diagnosing probes which provide to the measurement instrument information concerning the identification and status of the probe itself.

STATEMENT OF PRIOR ART

The very wide variety of modern electronic equipment creates a similar variety of testing and measurement (T&M) requirements, and a need in each case to establish a proper test setup. That setup includes both the appropriate T&M instrumentation and the signal acquisition probes which will connect to the circuitry under test. In view of the numerous different T&M situations that may be encountered, the probes to be employed must also be available in a number of different types and configurations.

Such probes may be active or passive, current or voltage sensing, or impedance matching. With respect to digital devices, such probes may contain a number of data channels and may vary as to their threshold voltages, bandwidths, or input resistance or capacitance. Similar variations may occur in the output or termination circuitry of such probes. For use with digital analyzers, such probes may include clock inputs to the measurement instrument, or clock or data qualification of the data to be transmitted.

A signal acquisition probe may also be multipurpose, having several internal configurations with respect to attenuation, channel access or the like that are switch-selectable. Similarly, a probe may incorporate a compensation capacitor for adjusting the probe's response to high frequency signals, or digital compensation circuitry for achieving proper compensation of an analog signal. A probe may also have separate head, cable, and termination units, the proper combination of which are assembled for a particular measurement situation.

In any of these cases, or in other cases that will be known to persons of ordinary skill in the art, the use of a "wrong" probe, or of a probe which is not properly calibrated, compensated, or otherwise appropriately configured, may introduce substantial error into the T&M process. Because of the subtle variations that may exist even among probes or test instruments of a given type, selection of the "correct" probe and configuration may have to be carried out with respect to each individual instrument.

Simply to set up for a measurement, therefore, may become a complex and time-consuming process. Such complexity may derive not only from the selection process itself, but also from the need to maintain records of the information necessary to make that selection correctly.

It would thus be useful to have immediate access to the information necessary to carry out a T&M setup, or at least to confirm that a setup has been correctly made. To aid in such setting up, the probes themselves and their various components typically carry labels that identify their type. Similarly, one may usually determine whether probe switches, such as an attenuator switch, are set correctly. However, one can not look at a probe and determine whether it is properly compensated, or is otherwise correctly configured internally. Also, some external indicia is needed to determine whether a particular probe of the required type is one which happens to work best, say, with a particular oscilloscope. It would then be useful as well to have that kind of information provided otherwise, and preferably by the probe itself.

It has become a standard practice in the electronics art to provide microprocessor control of T&M instruments, many of which have the capability of transmitting and receiving digital data and instructions. A significant number of such instruments also have the ability to provide visual displays of the data so treated, and to generate error messages therefrom. Interface between instruments having such capability is very often through systems of a standard design, such as the IEEE-488 General Purpose Interface Bus (GPIB). A code format such as ANSI X3.42 must also be employed, and a code selected such as ASCII or EBCDIC. In Tektronix instruments, for example, ASCII code having the most significant data first is employed uniformly.

However, very few prior art electrical or electronic probes convey any information other than electrical signal data from a circuit under test. In particular, little or no information is conveyed as to the probe's identification or status, except such as is apparent from its gross appearance and through the information printed on its label. Limited additional information can be found through use of such probes as the P6053B, P6055, P6062B and P6063 series of passive probes manufactured by Tektronix, Inc., which provide a direct digital readout of their attenuation settings to the oscilloscope to which they are connected. Another means for conveying information other than T&M signals from a probe to a screen is found in systems for trace identification, i.e., an operator may "key" the probe to cause visible indication on the screen of the particular trace corresponding to that probe when operating in a dual-trace mode.

Absent such electronic indication processes, only the probe or component type, and perhaps some limited information with respect to voltage ratings and the like, can be derived from the probe itself and its labelling. Other information of interest must be derived, for example, from an associated specification sheet or manual. Even then, little may be learned from a type specification table concerning the detailed characteristics of a particular probe of the type, what individual variations in such characteristics may result from the use of different cables or terminations, and certainly nothing with respect, say, to the compensation status of a probe at a particular time, or what compensation setting the probe ought to have in particular cases.

It would then be useful as well, once a probe has been optimally configured for a given measurement situation, in terms both of the probe combination itself and of any probe adjustments that can be made, to be able to recapture that information after the probe has been laid aside. Without such recapture, it may be necessary, for example, to re-connect the probe to an appropriate signal source and re-compensate, and perhaps to re-confirm by other means that the most suitable combination of head, cable, and termination is being employed.

Again, it would be desirable to have the probe itself provide the necessary information as to the configuration needed for particular purposes, with which specific T&M equipment it should be employed, its proper compensation or attenuation settings, optional cable lengths, and the like. Similarly, when a probe has been connected for a particular measurement situation, information should be provided which will establish whether that configuration is appropriate or not. It is to such objectives that the present invention is directed, together with such other objectives and advantages as will, from the nature of this invention, become apparent to those persons having ordinary skill in the art.

SUMMARY OF THE INVENTION

A probe assembly in accordance with the invention includes a memory into which may be recorded such status information as the probe type, serial number, and type specification data. Means for transmitting such information to a test and measurement (T&M) instrument for display or for the generation of error messages are provided, along with the channels for transmitting T&M data. Transmission of such status data is controlled by a clock either within the T&M instrument or the probe assembly itself.

In another embodiment of the invention, data that are derived from actual use of the probe assembly may be entered into the T&M instrument and then stored in the probe assembly for future reference.

BRIEF DESCRIPTION OF THE DRAWINGS

FIG. 1 shows in block diagram form a first embodiment of the invention.

FIG. 2. illustrates pictorially a means for making mechanical connection of a device embodying the invention to a test and measurement instrument.

FIG. 3 shows in block diagram a second embodiment of the invention in the form of a device that incorporates an oscillator for generating timing signals.

DETAILED DESCRIPTION

Figure 4:
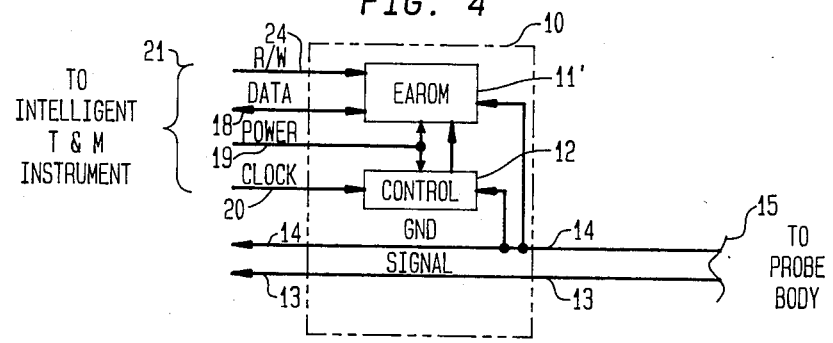
FIG. 4 shows in block diagram a third embodiment of the invention in the form of a device configured for transmitting data to and from the device.

A first, relatively simple embodiment of the present invention is illustrated in FIG. 1. A probe connector 10 houses a memory 11 and a control circuit 12. The ordinary function of the probe with respect to acquiring signal information from a circuit under test is provided by a signal line 13 and a ground line 14. That function is conventional and is not part of the present invention, except that memory 11 and control circuit 12 are connected to the same ground line 14. Connector 10, which is suitably adapted for attachment to an intelligent test and measurement (T&M) instrument (not shown), is coupled through a cable 15 to a conventional probe body 16, the tip 17 of which may be used to contact a circuit under test.

Memory 11 comprises a conventional digital memory device, and may be a read-only-memory (ROM), a programmable read-only-memory (PROM), a programmable logic array (PLA) or the like. In this simple embodiment of the invention, memory 11 is programmed at the time of manufacture of the probe assembly with a predetermined set of digital data, selected for purposes to be noted below. Control circuit 12 serves to control the transmission, through data line 18, of the digital data so encoded into memory 11 to an attached T&M instrument.

Both memory 11 and control circuit 12 require electrical power, which is provided by a power line 19 as shown in FIG. 1. In addition, a clock line 20 provides a clocking signal from the T&M instrument for the timing of various operations according to the invention, as will be described. For example, memory 11 may be a 1×2k bit ROM, and control circuit 12 a simple k- bit counter. The data encoded into memory 11 may then be transmitted sequentially to the T&M instrument upon imposition of a clocking signal on clock line 20 from the T&M instrument.

As noted, the function of the data line 18, power line 19 and clock line 20 is distinct from that of the signal line 13 (and ground line 14), and may use a separate mechanical connection to the T&M instrument. For example, as shown in FIG. 2, all of such former lines, and other lines to be discussed hereinafter, may be incorporated into a separate multi-lead cable 21 terminated by a conventional stereo plug 22, the latter being adapted for connection to the T&M instrument. Such a means of connection also provides a conspicuous indication that a particular probe assembly in fact embodies the present invention.

In using serial transmission of data through data line 18, there is no need for start/stop addressing. Through proper encoding, the beginning and end of the data sequence may also be recognized by the T&M instrument. In operation, a convenient code such as ASCII must also be employed. An 8-bit ASCII code in the range 2o to 5 F. with the most significant bit being o is then employed. The start of the data is indicated by a three-word sequence of 8 zeros, followed by 8 ones, and then 8 zeroes. Conversely, the end of the data is indicated by a three-word sequence of 8 ones, followed by 8 zeroes, and then 8 ones. The use of such start/stop encoding then leaves 122 additional ASCII words available in a 1024-bit memory, or 250 such words in a 2048-bit memory. Unused words may be encoded as a "space" (ASCII 2o).

The data to be encoded into memory 11 may include such items as the probe type nomenclature and perhaps an individual serial number. Other data that would typically appear in a type specification sheet may also be included. The quantity of data that may be encoded into the probe assembly in this manner will of course be limited by the size of memory 11.

The present invention does not itself seek to encompass the several functions that a T&M instrument may have which will earn it the "intelligent" appellation. These functions are well known in the art, either with respect to a T&M instrument (e.g., an oscilloscope) as such or to computers and microprocessor-controlled devices in general. As noted, standard code formats have then been developed to make the utilization of such art more effective. Even so, it is useful to discuss the present invention in the context of such "intelligent" functions, in order that the advantages of the present invention may be seen, and its several embodiments to be discussed below may be better understood.

Thus, it is well known for an instrument to be capable of receiving and storing digital data. That is a requirement, of course, in order for the instrument to take advantage of the present invention, which seeks to transmit such data thereto through data line 18. In addition, in order to utilize the embodiment of the present invention as described with reference to FIG. 1, such an instrument must also be capable of generating and transmitting an appropriate clock signal on clock line 20. An alternative embodiment of the invention eliminates the need for transmitting such a clock signal from the T&M instrument, and thus eliminates one of the lines (i.e., clock line 20) that must be carried in cable 21.

Specifically, in FIG. 3 there is shown an embodiment of the invention in which a probe connector 10' additionally houses an oscillator 23, which may be of conventional design and is also connected to ground line 14 and to power line 19. The output of oscillator 23 is connected to control circuit 12 and transmits timing pulses thereto in order to bring about a transmission of digital data from memory 11 to the data line 18 as previously discussed.

Oscillator 23 may be designed to operate at a frequency near that of the clocking signal within the T&M instrument, but not synchronized therewith. In order to provide such synchronization, it is necessary for the T&M instrument to be able to determine the frequency of oscillator 23. The T&M instrument must then be capable of sampling the data appearing on data line 18 at a much faster rate than the latter appears, say, at four times the frequency of oscillator 23. Use of an alternative coding for the data words will then permit them to be counted as they appear at the T&M instrument.

Such an alternative coding is shown below in Table I:

TABLE I

|  | MSB | LSB |
| --- | --- | --- |
| A0-AF | 1010 | xxxx |
| B0-BF | 1011 | xxxx |
| 40-4F | 0100 | xxxx |
| 50-5F | 0101 | xxxx |

By substituting the sequences Ao-AF and Bo-BF for 2o-2F and 3o-3F, respectively, it is then established that, if the Most Significant Bit (MSB) of each word is sent first, the appearance of a word in every case will be signified by the appearance either of a one bracketed by two zeroes, or by a zero bracketed by two ones. A counter within the T&M instrument encoded to respond to those bit patterns will then count each such word as it appears and may then force the writing of such data into memory within the instrument into synchrony with oscillator 23.

The embodiments of the invention as previously described represent cases in which permanently encoded data are employed. An alternative embodiment in which memory 11 may also be programmed after manufacture, i.e., when being employed in conjunction with a T&M instrument, then permits the storage within memory 11 of data pertaining to specific measurement conditions, and in a non-volatile manner.

Specifically, there is shown in FIG. 4 an embodiment of the invention in which connector 10 houses an electrically alterable read-only-memory (EAROM) 11' in place of the memory 11 previously employed. In addition, a Read/Write (R/W) line 24 connects through cable 21 from EAROM 11' to the T&M instrument. The other elements included in this embodiment of the invention are the same as those shown in FIG. 1.

The embodiment of the invention shown in FIG. 4 may then be further modified to allow connection between the probe assembly and the T&M instrument, other than for signal and ground purposes, to be made with three lines within cable 21 rather than the four lines as shown in FIG. 4. As is then shown in FIG. 5, a simple Read/Write-Clock (RWC) line 25 is provided, and the respective Read/Write and Clock signals are separated out within connector 10. An expanded view of a portion of connector 10 is shown in FIG. 5 to contain a capacitor 26 and a comparator 27 which will separate those signals as shown in a conventional manner.

Figure 5:
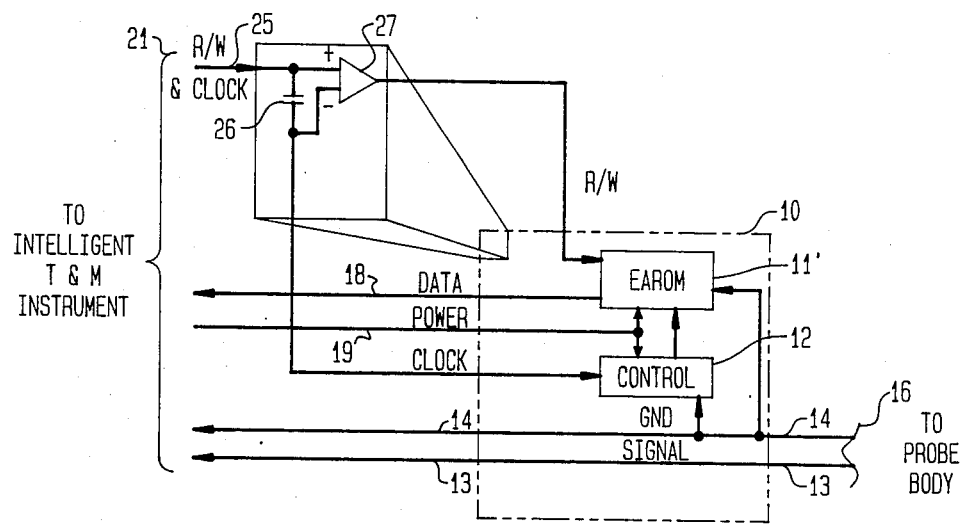
FIG. 5 shows in a partial circuit diagram a form of the device of FIG. 4 in which READ/WRITE and clock signals may be separated within the device.

In order to make use of the embodiments of the invention shown in FIGS. 4 or 5, a T&M instrument must have the capability (1) of transmitting Read/Write signals over R/W line 24 with respect to the embodiment of FIG. 4, or of transmitting a Read/Write-Clock signal over RWC line 25 with respect to the embodiment of FIG. 5, and (2) of transmitting digital data over data line 18 to be stored in EAROM 11'. For purposes of assisting in the T&M setup process, such data may include information acquired through actual use of the probe that was not available at the time of its manufacture. Such information may include such items as specific compensation data, i.e., with which particular T&M instrument it had been compensated, on what date, resulting in what specific probe setting for proper compensation, and the like. The T&M instrument must also be capable of accepting such data from the user, as by key entry or otherwise, and then storing such data for subsequent writing into EAROM 11' as previously stated.

In order to use the information stored in EAROM 11', the T&M instrument must have the capability of reading such data through data line 18 and then presenting it to the user in some fashion. That presentation may be by a simple screen display, or by generation of error messages, e.g., as when a probe assembly is connected to a specific T&M instrument with which it has not previously been employed. These and the procedures previously described that relate only to the T&M instrument itself do not constitute a part of the present invention.

The invention is instead concerned with the use of such procedures, in the manner described, as part of the electronic T&M procedure and as an aid thereto. For that purpose, while the foregoing description has been given in terms of particular examples of the kinds of information that can be stored into and retrieved from a memory such as EAROM 11' within the probe assembly, and also in terms of particular embodiments of the invention and variations thereof, it should be understood that no limitation in the scope of the invention is thereby intended, since a very many such variations upon the present invention will be apparent to those of ordinary skill in the art. Consequently, the scope of the present invention should be interpreted only from the claims appended hereto, and from the equivalents thereof.

I claim:

1. A probe assembly for providing a signal derived from a test point to an electronic instrument, comprising:
   memory circuit means storing data relating to at least one characteristic of the probe assembly, and
   control means for causing data stored in the memory circuit means to be retrieved from the memory circuit means and made available for transmission, whereby data stored in said memory circuit means can be transmitted to the electronic instrument.

2. A probe assembly according to claim 1, wherein the control means are responsive to a timing signal for causing the stored data to be retrieved from the memory circuit means.

3. A probe assembly according to claim 2, having a terminal for receiving the timing signal from a source that is external to the probe assembly and applying the timing signal to the control means.

4. A probe assembly according to claim 2, further comprising clock circuit means for generating the timing signal.

5. A probe assembly according to claim 1, wherein the memory circuit means comprise a read-only memory.

6. A probe assembly according to claim 1, wherein the memory circuit means comprise a programmable read-only memory.

7. A probe assembly according to claim 1, wherein the memory circuit means comprise an electrically-alterable read-only memory having a data terminal for receiving and transmitting data and a read/write terminal for receiving read and write enable commands.

8. A measurement system comprising, in combination:
a probe assembly having a probe tip for engaging a test point to provide a signal representing the operation of a device under test, memory circuit means storing data relating to at least one characteristic of the probe assembly, and control means for causing data stored in the memory circuit means to be retrieved from the memory circuit means and made available for transmission, and
an electronic instrument to which the probe assembly is coupled for receiving both the signal derived from the test point and stored data from the memory circuit means.

9. A measurement system according to claim 8, wherein the control means are responsive to a timing signal for causing stored data to be retrieved from the memory circuit means.

10. A measurement system according to claim 9, wherein the probe assembly comprises a clock circuit for generating the timing signal.

11. A measurement system according to claim 9, wherein the electronic instrument comprises a clock circuit for generating the timing signal and the probe assembly has a terminal for receiving the timing signal from the clock circuit and applying the timing signal to the control means.

12. A measurement system according to claim 8, wherein the memory circuit means comprise a read-only memory.

13. A measurement system according to claim 8, wherein the memory circuit means comprise a programmable read-only memory.

14. A measurement system according to claim 8, wherein the memory circuit means are electrically alterable and have a read/write terminal for receiving read and write enable commands from the electronic instrument and a data terminal for receiving data from and transmitting data to the electronic instrument.

15. A measurement system comprising, in combination:
a probe assembly having a probe tip for engaging a test point to provide a signal representing the operation of a device under test, electrically-alterable memory circuit means storing data relating to at least one characteristic of the probe assembly having a read/write terminal for receiving read and write enable commands and a data terminal for receiving data to be stored and for transmitting stored data, and control means for causing data stored in the memory circuit means to be retrieved from the memory circuit means and made available for transmission, and
an electronic instrument to which the probe assembly is coupled for receiving the signal derived from the test point and transmitting data to and receiving data from the memory circuit means.

* * * * *